United States Patent [19]
Adler et al.

[11] Patent Number: 5,556,793
[45] Date of Patent: Sep. 17, 1996

[54] METHOD OF MAKING A STRUCTURE FOR TOP SURFACE GETTERING OF METALLIC IMPURITIES

[75] Inventors: Steven J. Adler, Tempe; George W. Hawkins, Mesa; Israel A. Lesk, Phoenix; Peter L. Pegler; Hassan Pirastehfar, both of Mesa, all of Ariz.

[73] Assignee: Motorola, Inc., Schaumburg, Ill.

[21] Appl. No.: 144,623

[22] Filed: Nov. 1, 1993

Related U.S. Application Data

[63] Continuation-in-part of Ser. No. 842,953, Feb. 28, 1992, abandoned.

[51] Int. Cl.$^6$ ................................................ H01L 21/322
[52] U.S. Cl. .................................. 437/11; 437/12; 437/70
[58] Field of Search ............................ 437/10, 11, 12, 437/70; 148/DIG. 117, DIG. 85, DIG. 86, DIG. 60, DIG. 24; 156/DIG. 66

[56] References Cited

U.S. PATENT DOCUMENTS 5,220,192  6/1993  Owens et al. ........................ 437/70
5,242,854  9/1993  Solheim et al. ...................... 437/69

OTHER PUBLICATIONS

Wolf, S., et al, *Silicon Processing for the VLSI Era: vol. 1, Process Technology*, Lattice Press, 1986, pp. 63–65.
Wolf, S., *Silicon Processing for the VLSI Era: vol. 2, Process Integration*, Lattice Press, 1990, pp. 20–24, 30 & 31.

*Primary Examiner*—George Fourson
*Attorney, Agent, or Firm*—Bernard Berman; Harry A. Wolin; Rennie William Dover

[57] ABSTRACT

A method for gettering metallic impurities from a semiconductor substrate (25). A gettering structure is fabricated in inactive areas of a semiconductor chip (31). The gettering structure is manufactured by forming an oxide (30) having a bird's head structure contacting a heavily doped region (28). The combination creates precipitation nuclei to which the metallic impurities migrate. The metallic impurities are sequestered by the precipitation nuclei or trap sites and rendered incapable of degrading the electrical characteristics of a semiconductor device.

5 Claims, 3 Drawing Sheets

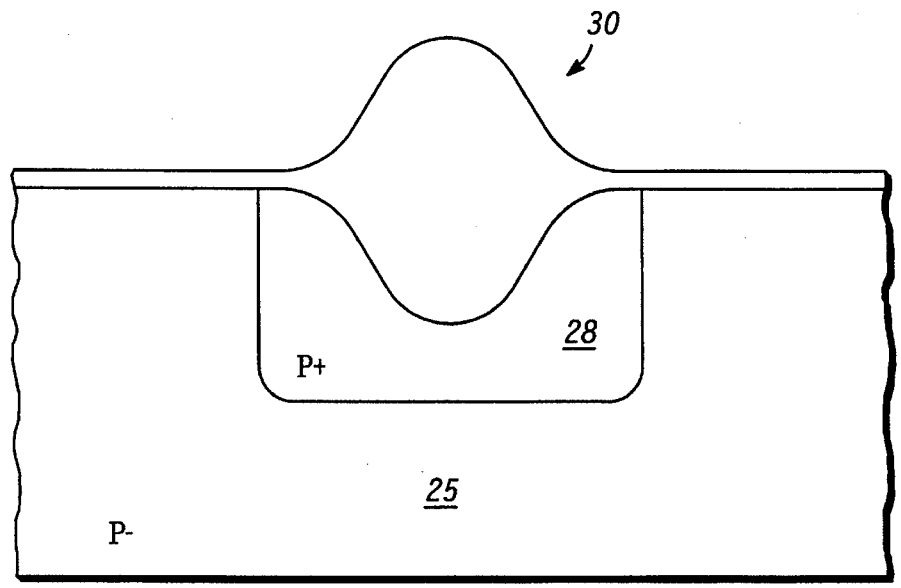
FIG. 3
FIG. 4
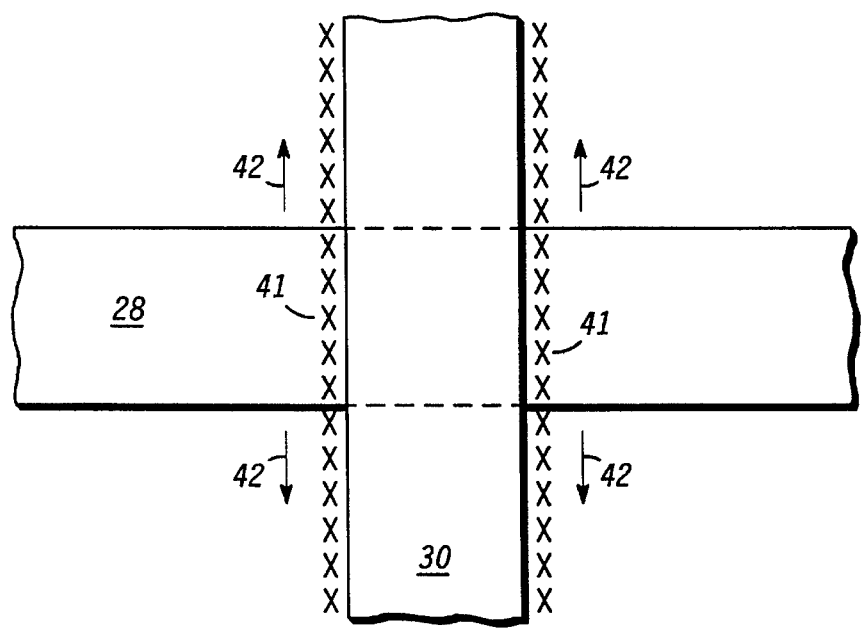

METHOD OF MAKING A STRUCTURE FOR TOP SURFACE GETTERING OF METALLIC IMPURITIES

This application is a continuation-in-part of prior application Ser. No. 07/842,953, filed Feb. 28, 1992, now abandoned.

BACKGROUND OF THE INVENTION

This invention relates, in general, to gettering and, in particular, to non-intrinsic top surface gettering of metallic impurities in a semiconductor substrate.

In general, each wafer fabrication process step is capable of introducing unwanted impurities into a semiconductor substrate. Metallic impurities, such as iron, nickel, and copper have been found to degrade electrical characteristics of semiconductor devices. For example, metal atoms in a lattice of a semiconductor substrate may serve as recombination and/or generation centers; thereby increasing junction leakage currents and lowering bipolar transistor current gains. Often, the metallic impurities are contained within precipitates which may form in a multitude of regions in the semiconductor substrate. A precipitate forming at the silicon-silicon dioxide interface may lower a barrier for electrons to enter the silicon dioxide thereby increasing the leakage current through the silicon dioxide film. A precipitate forming at or near a P-N junction may serve as a generation center for electrons and holes, resulting in a large increase in leakage current in the P-N junction.

One approach to eliminating unwanted metallic impurities is to remove the sources of the impurities from the wafer fabrication process. This approach has proven to be expensive, difficult to maintain, and economically unfeasible for older wafer processing lines. However, a practical, yet relatively inexpensive, technique for removing unwanted metallic impurities is gettering.

Gettering is a process for stably attaching atoms of metallic impurities to trap sites sufficiently remote from active areas on a wafer. The trap sites, commonly referred to as precipitation nuclei, are areas of defects in the crystal structure of a semiconductor wafer. Once attached to a trap site, the metallic impurities are prevented from diffusing through the semiconductor substrate. In other words, the attached metallic impurities are removed, essentially, from the useful regions of the semiconductor substrate. The concentration of metallic impurities in the semiconductor substrate is decreased in the vicinity of a trap site; consequently, a metallic impurity concentration gradient results from the sequestering of metallic impurities by trap sites. As a result of the concentration gradient, metallic impurities from other portions of the semiconductor substrate diffuse towards the trap sites. The diffused metallic impurities become attached to the trap sites. As diffusion and trapping of metallic impurities continues, the concentration of metallic impurities in active areas of the wafer, which are considerably displaced from the trap sites, is reduced appreciably.

The two primary gettering techniques are back-side gettering and intrinsic gettering. In back-side gettering, the unused or back side of a wafer is treated creating trap sites capable of sequestering metallic impurities. Because the trap sites are on a back side of the wafer, the metallic impurities are sequestered away from active areas. Various means for creating trap sites are known, including providing a heavy phosphorus diffusion, argon ion implantation, and deposition of a layer of polysilicon. Drawbacks of these techniques are that the phosphorus dopant may promote autodoping, the trap sites created by argon ion implantation may be eliminated by annealing at high temperatures, and the layer of polysilicon may oxidize at high temperatures. In general, the effectiveness of back-side gettering diminishes with high temperature wafer fabrication process steps.

The technique of intrinsic gettering is based on the precipitation of oxygen in the form of silicon dioxide particles in an inactive bulk area of a semiconductor wafer. The precipitated silicon dioxide particles create regions of high stress which trap metallic impurity atoms in the form of precipitates. Although this technique is useful, it requires strict control of the oxygen content in the semiconductor wafer in concert with specific process steps to form the silicon dioxide precipitates. According to Silicon Processing for the VLSI Era, Volume 1, by S. Wolf and R. N. Tauber, precipitation of oxygen does not occur when the oxygen content is below a lower bound. Moreover, too many oxygen precipitates are formed when the concentration of oxygen exceeds an upper bound. In addition, the size distribution of the silicon dioxide precipitates must be controlled to maximize gettering. Further, back-side and intrinsic gettering techniques tend to be one-dimensional wherein the metallic impurities travel essentially vertically through a semiconductor wafer.

Accordingly, it would be advantageous to have a gettering technique that is economical and capable of fitting into current and future wafer fabrication techniques. Moreover, the gettering technique should be somewhat insensitive to thermal cycling and concentrations of constituents now commonly used for gettering such as, for example, oxygen or phosphorus. Additionally, the gettering technique should be capable of inactivating a large quantity of metallic atoms, commonly referred to as having a large gettering capacity. Finally, the gettering technique should not be limited to one-dimensional movement of the metallic impurity precipitates.

SUMMARY OF THE INVENTION

Briefly stated, the present invention is a method for gettering metallic impurities in a semiconductor material. Gettering structures are formed from top surface portions of semiconductor chip inactive areas. The gettering structures comprise a plurality of precipitation nuclei or defectivity sites within the semiconductor material, wherein such precipitation nuclei are generated in a region where two high stress structures are superimposed. In one embodiment, a heavily doped area is coincident with an area stressed by an oxide having a bird's head structure. A coincident combination of two stress inducing features, such as oxide growth and heavy doping, act synergistically to severely stress areas of the semiconductor material and form a plurality of precipitation nuclei. Additional precipitation nuclei may be formed sequentially in a wave-like fashion travelling along a path prescribed by a high stress feature. The precipitation nuclei serve to sequester metallic impurities away from active areas on the semiconductor chip. Thus, the metallic impurities are precluded from degrading the electrical characteristics of semiconductor devices.

BRIEF DESCRIPTION OF THE DRAWINGS

FIGS. 2–3 illustrate simplified cross-sections of a portion of an inactive area of a semiconductor chip during different stages of fabrication in accordance with the present invention;

FIG. 4 illustrates a top view of an oxide having a bird's head structure crossing over and contacting a heavily doped region in accordance with the present invention.

DETAILED DESCRIPTION OF THE DRAWINGS

Figure 1:
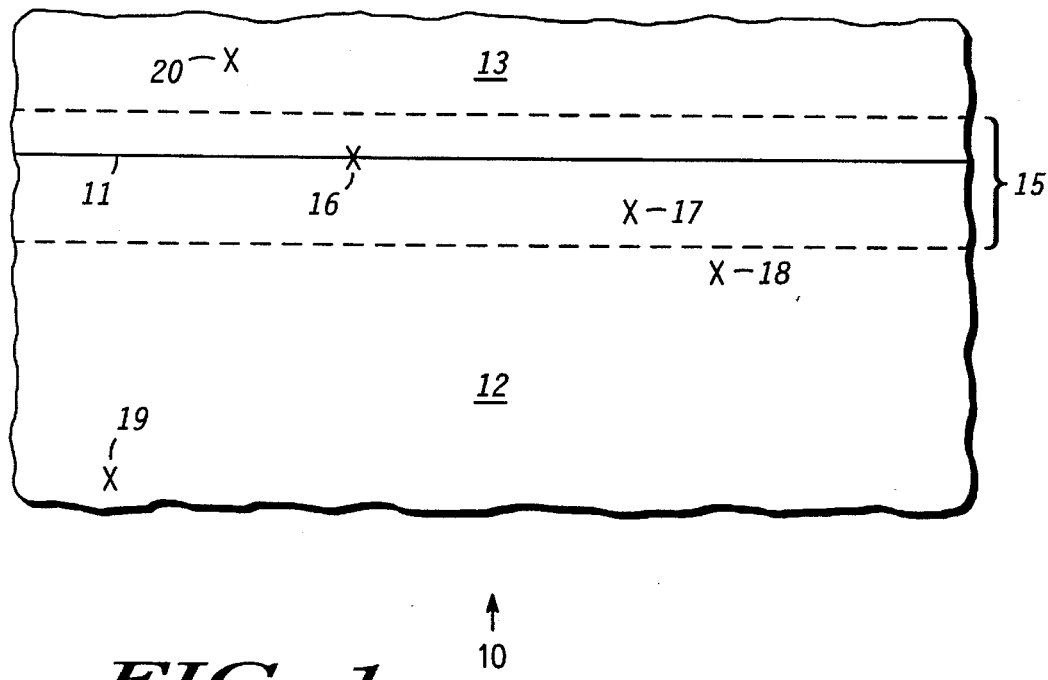
FIG. 1 illustrates a highly enlarged cross-sectional view of a portion of a semiconductor device having a plurality of metallic impurity precipitates.

FIG. 1 illustrates a highly enlarged cross-sectional view of a portion 10 of a semiconductor device having a plurality of metallic impurity precipitates 16–20. Portion 10, shown in FIG. 1, includes a region 12 of semiconductor material having P conductivity type and a region 13 of semiconductor material having N conductivity type. Regions 12 and 13 are contiguous and form a P-N junction 11 having a depletion region 15 existing on both sides of P-N junction 11. Depletion region 15 extends from P-N junction 11 into regions 12 and 13.

The metallic impurities contained in precipitates 16–20 were previously dissolved in solid solution, a state in which they are capable of diffusing through regions 12 and 13. Some metallic impurities are capable of rapidly diffusing long distances in semiconductor materials at nominal temperatures. For example, iron can travel approximately 3,000 micrometers in thirty minutes at 1,000° C. and copper can travel approximately 600 micrometers in one minute at 900° C.

The influence metallic impurity precipitates 16–20 have on device characteristics is a function of their location within the semiconductor device. A metallic impurity precipitate 16, 17, or 18 located on P-N junction 11, within depletion region 15, or within a diffusion length of depletion region 15, respectively, creates a generation current. Thus, metallic impurities in these locations degrade device characteristics such as P-N junction leakage current and P-N junction breakdown voltages. Precipitates 19 and 20, on the other hand, are beyond their respective diffusion lengths from depletion region 15 and do not produce generation currents. Therefore, a method for removing metallic impurities such as those in precipitates 16–20 from active areas in semiconductor wafers will improve device characteristics.

Figure 2:
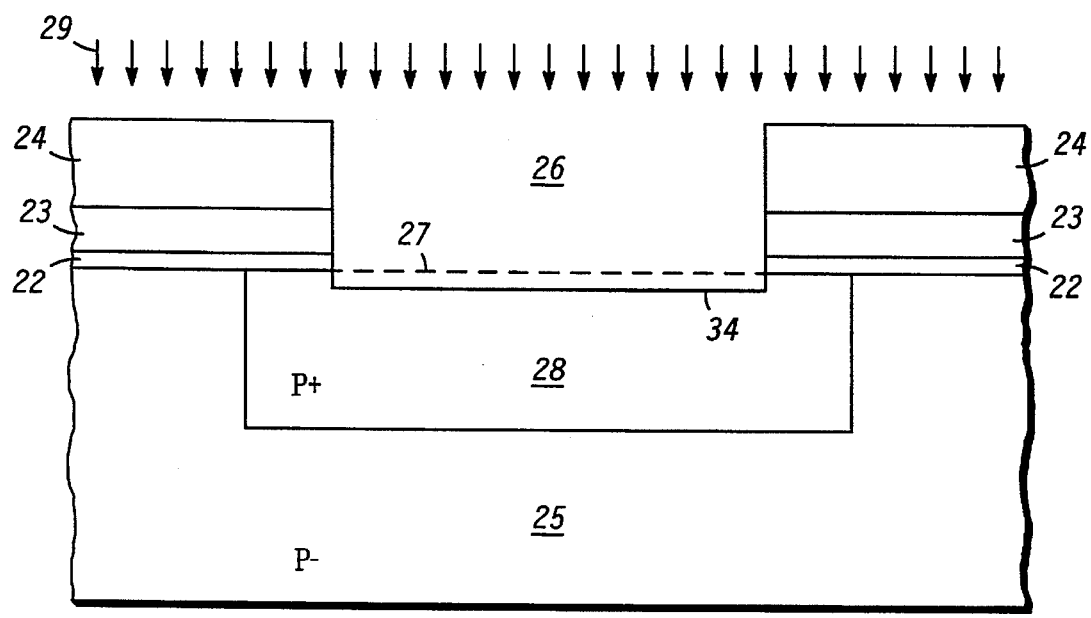

FIGS. 2–3 illustrate simplified cross-sections of a portion of an inactive area of a top surface gettering structure of a semiconductor chip having, for example, a silicon substrate during different stages of fabrication. The top surface gettering structure serves as a metallic impurity gettering structure having a non-intrinsic gettering means in at least one inactive area. Those of skill in the art will understand that the semiconductor chips are first prepared in the form of wafers containing many identical chips each having active areas or regions and inactive areas or regions. The wafers are cut apart to yield individual chips wherein each chip has one or more active areas containing semiconductor devices and inactive areas containing alignment markers, production control devices, and unused regions.

Referring now to FIG. 2, a buffer or pad oxide 22, an oxidation mask layer 23 of, for example, silicon nitride, and a photomask layer 24 are provided on a semiconductor substrate 25. Preferably, buffer oxide 22 has a thickness of about 700 angstroms, and oxidation mask layer 23 has a thickness of about 1,500 angstroms. Substrate 25 is, for example, silicon having a P⁻ conductivity type. A typical concentration of impurity material in semiconductor substrate 25 is, for example, approximately $3 \times 10^{15}$ atoms/cm³. It shall be understood that the semiconductor material of the present invention is not limited to silicon having P⁻ conductivity type. As a second example, semiconductor material 25 may be an epitaxial layer of N⁻ conductivity type grown over a semiconductor material of N⁺ conductivity type. Further, buffer oxide 22 is desirable but not essential.

A mask opening 26 is provided extending through layers 22, 23, and 24 to semiconductor substrate 25, using means well known in the art, to expose a top surface of a first region. A portion 27 of a surface of silicon substrate 25 may be removed, leaving a depressed surface 34. A heavily doped region 28 of P⁺⁺ conductivity type is formed in the first region typically by ion implantation of an impurity material 29 through mask opening 26. A heavily doped region or a region of P⁺⁺ conductivity type is defined as a region having a dopont surface concentrated of at least $5 \times 10^{19}$ atoms/cm³. A suitable impurity material is boron, although other impurity materials may be used. Preferred implant conditions are about 70 keV and $1 \times 10^{16}$ ions/cm² followed by thermal anneal at 1,200° C. for times up to about 80 minutes. The resulting boron surface concentration of region 28 is approximately $5 \times 10^{19}$ atoms/cm³.

Heavily doped region 28 serves as a first structure or stress mechanism to stress a semiconductor crystal lattice in region 28 thereby increasing the probability of defects occurring in the semiconductor crystal lattice when a second stress mechanism or stress structure is applied. While ion implantation is preferred for forming region 28, it is not essential and any means for introducing a high concentration of impurity material into region 28 may be used. Such means are well known in the art. Photoresist mask layer 24 is removed. Further, a portion (not shown) of oxidation mask layer 23 is removed, using means well known in the art thereby exposing areas of the chip on which a field oxide may be formed.

Referring now to FIG. 3, doped region 28, exposed through opening 26, is oxidized using means well known in the art to form an oxide 30 having a bird's head structure wherein oxide 30 may be a portion of an oxide layer. For example, oxide 30 may be formed by a wet oxidation process at a temperature of about 920° C. and a pressure of around 10 atmospheres for approximately 4 hours. Oxidation masking layer 23 facilitates formation of an oxide 30 into a bird's head structure upon oxidation through opening 26. Further, field oxide areas (not shown) are formed having a thickness between, approximately, 10,000 and 25,000 angstroms. Thus, a thickness of the bird's head oxide can be 25,000 angstroms. Techniques for forming an oxide 30 having a bird's head structure are well known to those of skill in the art.

It shall be understood that the order of the steps illustrated in FIGS. 2–3 may be interchanged. In other words, oxide 30 having the bird's head structure may be formed first and doped region 28 thereafter. It shall be further understood that doped region 28 may not extend as far into the semiconductor material compared to the example of providing the dopant before forming oxide 30. Initiation of precipitation nuclei requires that oxide 30 contact a portion of doped region 28. Thus, precipitation nuclei will generally initiate along the border of doped region 28 and oxide 30.

Dielectric mask layer 23 is removed using means well known in the art.

As shown in FIG. 3, oxide 30 is within a heavily doped region 28. Doped region 28 and oxide 30 having the bird's head structure function synergistically to create defectivity sites within the crystal lattice of the semiconductor substrate. Typically, the defectivity sites form in the semiconductor material under bird's head structures having high curvature. The defectivity sites serve as precipitation nuclei or trap sites. The high doping level in doped region 28 stresses the crystal lattice. In addition oxide 30 also stresses the crystal lattice. The combination of doped region 28 and oxide 30 causes a first precipitation nucleus to form. The first precipitation nucleus results in a local stress relaxation and an increased stress in adjacent regions thereby forming a second and a third precipitation nucleus. The second and third precipitation nuclei are adjacent to the first precipitation nucleus. In a like manner, additional precipitation nuclei are formed adjacent to the second and third precipitation nuclei. A plurality of precipitation nuclei continue to form sequentially in a wave-like fashion travelling in both directions around the area having oxide 30 coincident with doped region 28, i.e. along a stress nucleation track. These nuclei then attract metal impurities.

Although formation of oxide 30 having the bird's head structure in conjunction with heavily doped region 28 forms precipitation nuclei, it shall be understood that the present invention is not limited to this combination. Other means for stressing the semiconductor material in a region of high doping 28 may produce precipitation nuclei.

FIG. 4 illustrates a top view of oxide 30 crossing over doped region 28 wherein oxide 30 and doped region 28 contact one another at an intersection and form a plurality of precipitation nuclei 41. One of the plurality of precipitation nuclei 41 will be formed along the intersection of oxide 30 and doped region 28. Upon initiation of the one precipitation nucleus, the plurality of precipitation nuclei 41 may form in a predetermined fashion, travelling as waves in both directions along oxide 30, as indicated by arrows 42. The formation of precipitation nuclei 41, once initiated, is capable of extending a long distance, one centimeter or more, along oxide 30 into regions lacking a heavy doping, thereby producing a large number of precipitation nuclei. Thus, significant gettering may occur when oxide 30 having a bird's head structure and heavily doped region 28 contact each other in only a few locations.

Figure 5:
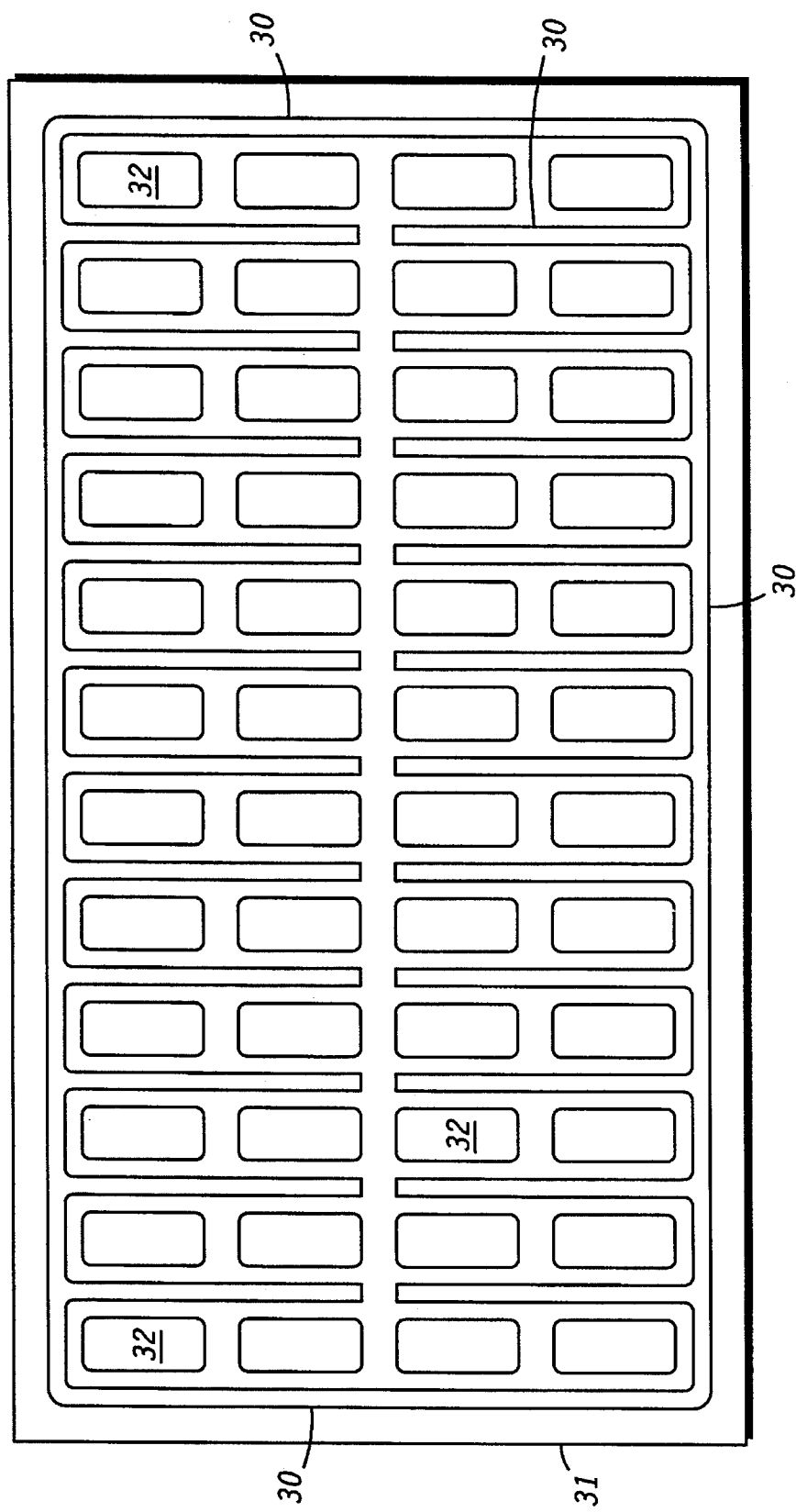
FIG. 5 illustrates a simplified top view of a semiconductor chip in accordance with the present invention.

FIG. 5 illustrates a simplified top view of one embodiment of the present invention. FIG. 5 shows a semiconductor chip 31 having a plurality of active areas 32 disposed therein. A doped region 28 and an oxide 30 having a bird's head structure surround active areas 32, and are interspersed with portions of active areas 32. Oxide 30, surrounding and interspersed with active areas 32, serves as a stress nucleation track around which a plurality of precipitation nuclei form. Thus a large area may contain precipitation nuclei. A large number of precipitation nuclei form along oxide 30 having the bird's head structure in heavily doped region 28. The large number of precipitation nuclei translates into a large capacity for gettering metallic impurities. Moreover, the plurality of precipitation nuclei are formed rapidly thereby quickly sequestering metallic impurities.

By now it should be appreciated that there has been provided a novel gettering technique which combines two stress inducing features, oxide growth and heavy doping, to form precipitation nuclei in inactive areas. The combination of stress features forms precipitation nuclei in inactive areas before they are able to form in active areas. The new gettering technique, referred to as top surface gettering, constitutes a third method for gettering; in addition to the techniques of back-side and intrinsic gettering. Top surface gettering readily fits into standard processing flows and may be incorporated into already existing process steps. Therefore, in many cases, this new gettering technique may be incorporated without the need for additional masking steps thereby avoiding an increase in production time.

In addition, top surface gettering can overcome the phenomenon of autodoping because heavy back surface phosphorus doping is not needed. The thermal cycling effects of annealing and oxidation are rendered moot since the precipitation nuclei formed by this method do not release metallic impurities as a consequence of thermal cycling used in wafer fabrication. Further, the new gettering technique is preferred over intrinsic gettering since it is insensitive to ranges of oxygen concentration.

Other advantages of top surface gettering include three dimensional gettering and the increase in gettering capacity because of the number of precipitation nuclei and the area over which the precipitation nuclei may be formed. Finally, the new top surface gettering technique enables semiconductor manufacturers to use relatively dirty processes while still maintaining high yields because of the large gettering capacity.

We claim:

1. A method for fabricating a top surface gettering structure, which comprises the steps of:

providing a semiconductor chip having at least one active area and at least one inactive area;

doping a first region of the at least one inactive area through a top surface, the dopant surface concentration of the first region being at least approximately $5 \times 10^{19}$ atoms/cm$^3$;

forming at least one oxide layer having a bird's head structure in the first region in contact with at least one portion of the first region having the dopant; and forming a plurality of precipitation nuclei along a border of the first region and the oxide layer.

2. The method for fabricating a top surface gettering structure of claim 1 further including the step of forming the at least one oxide layer having the bird's head structure using an oxidation mask and a wet oxidation process.

3. A method for top surface gettering of metallic impurities in a semiconductor material, comprising the steps of:

providing a semiconductor material having a plurality of inactive areas and a plurality of active areas;

doping said plurality of inactive areas to a dopant surface concentration of approximately $5 \times 10^{19}$ atoms/cm$^3$; and forming an oxide layer having a bird's head within said plurality of inactive areas wherein said oxide layer serves as a stress nucleation track.

4. A method for sequestering contaminants, comprising the steps of:

providing a semiconductor substrate having at least one active region and at least one inactive region wherein a portion of the inactive region is a field region;

doping said field region to a dopant surface concentration of approximately $5 \times 10^{19}$ atoms/cm$^3$; and forming a non-intrinsic gettering means, wherein an oxide layer having a bird's head is formed within the field region and wherein at least one trap site is formed from a top surface of the semiconductor substrate within the field region.

5. The method for sequestering contaminants of claim 4, further including forming the oxide layer with a thickness of at least 10,000 angstroms.

* * * * *